United States Patent
Higashi et al.

(10) Patent No.: US 9,136,422 B1
(45) Date of Patent: Sep. 15, 2015

(54) TEXTURING A LAYER IN AN OPTOELECTRONIC DEVICE FOR IMPROVED ANGLE RANDOMIZATION OF LIGHT

(75) Inventors: Gregg Higashi, San Jose, CA (US); Brendan M. Kayes, San Francisco, CA (US); Frank Reinhardt, Tracy, CA (US); Sylvia Spruytte, Palo Alto, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 313 days.

(21) Appl. No.: 13/354,175

(22) Filed: Jan. 19, 2012

(51) Int. Cl.
 *H01L 21/00* (2006.01)
 *H01L 31/18* (2006.01)

(52) U.S. Cl.
 CPC ...................... *H01L 31/18* (2013.01)

(58) Field of Classification Search
 CPC ............ H01L 31/0236; H01L 31/02363; H01L 31/02366
 USPC .......................................................... 438/71
 See application file for complete search history.

(56) References Cited

U.S. PATENT DOCUMENTS

| | | | |
|---|---|---|---|
| 5,101,260 A * | 3/1992 | Nath et al. | 257/53 |
| 7,875,945 B2 * | 1/2011 | Krasnov et al. | 257/436 |
| 8,183,081 B2 * | 5/2012 | Weidman et al. | 438/72 |
| 8,258,596 B2 * | 9/2012 | Nasuno et al. | 257/458 |
| 2007/0151596 A1 * | 7/2007 | Nasuno et al. | 136/256 |
| 2009/0151784 A1 * | 6/2009 | Luan et al. | 136/256 |
| 2010/0015751 A1 * | 1/2010 | Weidman et al. | 438/72 |
| 2011/0088771 A1 * | 4/2011 | Lin et al. | 136/256 |
| 2011/0156000 A1 * | 6/2011 | Cheng | 257/13 |
| 2011/0290322 A1 * | 12/2011 | Meguro et al. | 136/256 |
| 2012/0104411 A1 * | 5/2012 | Iza et al. | 257/76 |
| 2012/0160296 A1 * | 6/2012 | Laparra et al. | 136/244 |
| 2013/0026481 A1 * | 1/2013 | Xu et al. | 257/76 |
| 2013/0112258 A1 * | 5/2013 | Park et al. | 136/256 |

OTHER PUBLICATIONS

"Volmer—Weber and Stranski—Krastanov InAs- Al,Ga . . . As quantum dots emitting at 1.3 um" to Ledentsov et. al.*
"The Stranski—Krastanov Three Dimensional Island Growth Prediction on Finite Size Model" to Othaman et. al.*
"Volmer—Weber and Stranski—Krastanov InAs-,, Al,Ga . . . As quantum dots emitting at 1.3 mm" by Tsatsul'nikov et al.*

* cited by examiner

*Primary Examiner* — Charles Garber
*Assistant Examiner* — Evren Seven
(74) *Attorney, Agent, or Firm* — Sawyer Law Group, P.C.

(57) ABSTRACT

Embodiments generally relate to optoelectronic devices and more specifically, to textured layers in optoelectronic devices. In one embodiment, a method for providing a textured layer in an optoelectronic device includes depositing a first layer of a first material and depositing an island layer of a second material on the first layer. Depositing the island layer includes forming one or more islands of the second material to provide at least one textured surface of the island layer, where the textured surface is operative to cause scattering of light.

15 Claims, 8 Drawing Sheets

TEXTURING A LAYER IN AN OPTOELECTRONIC DEVICE FOR IMPROVED ANGLE RANDOMIZATION OF LIGHT

BACKGROUND

1. Field of the Invention

Embodiments of the invention generally relate to optoelectronic semiconductor devices, such as photovoltaic devices including solar cells, and methods for fabricating such devices.

2. Description of the Related Art

The use of optoelectronic devices, such as photovoltaic devices and light emitting diodes (LEDs), is becoming more widespread as energy efficiency increases in importance. In a photovoltaic device such as a solar cell, the junction of a solar cell absorbs photons to produce electron-hole pairs, which are separated by the internal electric field of the junction to generate a voltage, thereby converting light energy to electric energy. The absorber layer of an ideal photovoltaic (PV) device would absorb all of the photons impinging on the PV device's front side facing the light source since the open circuit voltage ($V_{oc}$) or short circuit current ($I_{sc}$) is proportional to the light intensity. However, several loss mechanisms typically interfere with the PV device's absorber layer absorbing all of the light reaching the front side of the device. For example, some photons may pass through the absorber layer without affecting any electron-hole pairs and thus never contribute to generating electrical energy by the device. In other cases, the semiconductor layers of the PV device may be shiny and, therefore, may reflect a substantial portion of the impinging photons, preventing these photons from ever reaching the absorber layer.

Accordingly, there is a need for optoelectronic devices with increased efficiency and methods for fabricating such optoelectronic devices at reduced costs and greater flexibility when compared to conventional optoelectronic device fabrication.

SUMMARY

Embodiments of the inventions generally relate to optoelectronic semiconductor devices such as photovoltaic devices (including solar cells) and light emitting diodes (LEDs), and more specifically to textured layers in optoelectronic semiconductor devices.

In one embodiment, a method for providing a textured layer in an optoelectronic device includes depositing a first layer of a first material, and depositing an island layer of a second material on the first layer. Depositing the island layer includes forming one or more islands of the second material to provide at least one textured surface of the island layer, wherein the at least one textured surface is operative to cause scattering of light. In other embodiments, a method for providing an optoelectronic device includes depositing an absorber layer and depositing an emitter layer. For example, the absorber layer can be over the emitter layer or the emitter layer can be over the absorber layer in various embodiments. A first layer of a first material is deposited over the emitter layer and the absorber layer. An island layer of a second material is deposited on the first layer, including forming one or more islands of the second material during the deposition of the island layer to provide at least one textured surface operative to cause scattering of light. A dielectric layer can be deposited over the island layer and a metal layer can be deposited over the dielectric layer, or in other embodiments, an anti-reflective layer can deposited over the island layer.

BRIEF DESCRIPTION OF THE DRAWINGS

The appended drawings illustrate only some embodiments and are therefore not to be considered limiting of scope.

DETAILED DESCRIPTION

Embodiments of the inventions generally relate to optoelectronic devices and processes, and more specifically to optoelectronic semiconductor devices including one or more textured layers and the fabrication processes for forming such optoelectronic devices.

Herein, a layer can be described as being deposited "over" one or more other layers. This term indicates that the layer can be deposited directly on top of the other layer(s), or can indicate that one or more additional layers can be deposited between the layer and the other layer(s) in some embodiments. Also, the other layer(s) can be arranged in any order.

Embodiments disclosed herein relate to light trapping using textured layer(s) for greater device efficiency.

Figure 1:
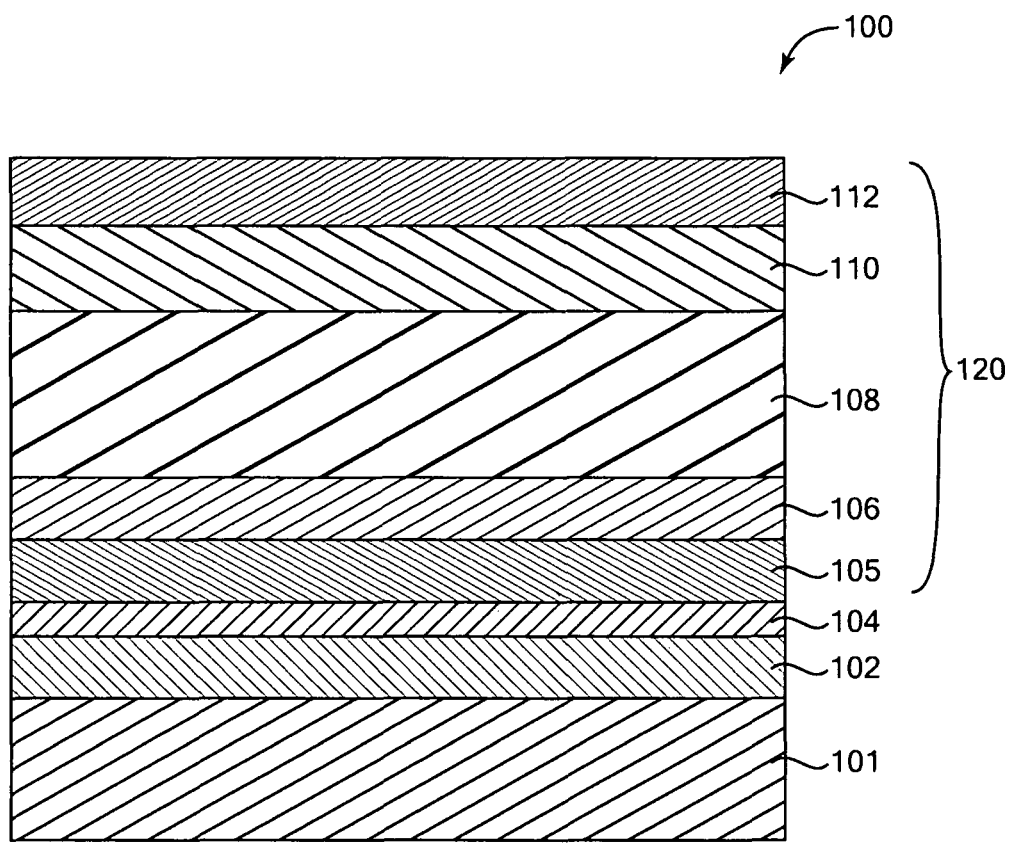
FIG. 1 depicts a cross-sectional view of a photovoltaic device in accordance with some embodiments described herein.

FIG. 1 illustrates a cross-sectional view of one embodiment of a photovoltaic device 100 suitable for use with embodiments described herein. Although examples herein relate to photovoltaic devices, described features can also be applied to other optoelectronic semiconductor devices, such as LEDs, e.g., to scatter light in the device to provide increased or more efficient light generation.

Device 100 includes a cell 120 coupled with a growth wafer 101 by an ELO release layer or sacrificial layer 104 disposed therebetween. Multiple layers of epitaxial materials containing varying compositions are deposited within the photovoltaic device 100. The various layers of epitaxial materials may be grown or otherwise formed by a suitable method for semiconductor growth. Cell 120 can be, for example, a gallium arsenide based cell with layers made of Group III-V materials. The Group III-V materials are thin films of epitaxially grown layers. In some embodiments the epitaxially grown layers can be formed by growing Group III-V materials during, for example, a high growth rate vapor deposition process. A high growth rate deposition process allows for growth rates of greater than 5 μm/hr, such as about 10 μm/hr or greater, or as high as about 100 μm/hr or greater. The high growth rate process includes heating a wafer to a deposition temperature of about 550° C. or greater, within a processing system, exposing the wafer to a deposition gas containing a chemical precursor, such as gallium precursor gas and arsine for a gallium arsenide deposition process, and depositing a layer containing gallium arsenide on the wafer. The deposition gas may contain a Group V precursor, such as arsine, phosphine, or ammonia.

The deposition processes for depositing or forming Group III-V materials, as described herein, can be conducted in various types of deposition chambers. For example, one continuous feed deposition chamber that may be utilized for growing, depositing, or otherwise forming Group III-V materials is described in the commonly assigned U.S. patent application Ser. Nos. 12/475,131 and 12/475,169, both filed on May 29, 2009, which are herein incorporated by reference in their entireties.

Some examples of layers usable in device 100 and methods for forming such layers are disclosed in copending U.S. patent application Ser. No. 12/939,077, filed Nov. 3, 2010, and incorporated herein by reference in its entirety.

In some embodiments, one or more buffer layers 102 may be formed on the growth wafer 101 in order to start forming the photovoltaic device 100. The growth wafer 101 may include, for example, an n-type or semi-insulating material, and may include the same or similar material as the one or more subsequently deposited buffer layers. A p-type material can be included in other embodiments.

A sacrificial layer (ELO release layer) 104 can be deposited on the growth wafer 101 or buffer layer 102 (if present). The sacrificial layer 104 can contain a suitable material, such as aluminum arsenide (AlAs) or an aluminum arsenide alloy, and is utilized to form a lattice structure for the layers contained within the cell 120, and then etched and removed during the ELO process.

Layers of the photovoltaic cell 120 can be deposited over the sacrificial layer 104, which in some embodiments can include a front contact layer 105, a front window 106, an absorber layer 108 formed adjacent the front window 106, an emitter layer 110, and a base layer 112 for texturing. The front semiconductor contact layer 105, or interface layer, can be deposited on the sacrificial layer 104. The front contact layer 105 can, in some embodiments, be an n-doped layer comprising Group III-V materials, such as gallium arsenide.

A front window 106, also known as a passivation layer, can be formed above the substrate 101 on the sacrificial layer 104, or if present, on the optional contact layer 105. The front window 106 may be transparent to allow incident photons to pass through the front window 106 on the front side of the cell 120 to other underlying layers. In some examples, the front window 106 may comprise a Group III-V material.

An absorber layer 108 can be formed above the window layer 106. The absorber layer 108 can comprise any suitable Group III-V compound semiconductor, such as gallium arsenide (GaAs). In some embodiments, the absorber layer 108 can be monocrystalline and can be n-doped. Different embodiments can provide different doping concentrations, such as a range from about $1\times10^{16}$ cm$^{-3}$ to about $1\times10^{19}$ cm$^{-3}$.

An emitter layer 110 may be formed above the absorber layer 108 in some embodiments. The emitter layer 110 can, in some embodiments, be p-doped (e.g., p$^+$-doped). The emitter layer 110 may comprise any suitable Group III-V compound semiconductor and can be monocrystalline. For example, the doping concentration of a heavily p-doped emitter layer 110 may be within a range from about $1\times10^{17}$ cm$^{-3}$ to about $1\times10^{20}$ cm$^{-3}$. In some embodiments, the emitter layer 110 can form a heterojunction with the absorber layer 108.

In some embodiments, the contact of an n-type absorber layer 108 with a p-type emitter layer 110 creates a p-n junction for absorbing photons. Other embodiments can include one or more intermediate layers between absorber layer 108 and emitter layer 110. Other embodiments may use a p-doped base/absorber layer and an n-doped back/emitter layer, and/or other p-/n-doped layers in place of n-/p-doped layers in the descriptions herein.

A base layer 112 for texturing can optionally be deposited over the emitter layer 110. The base layer 112 can provide a first layer on which an island layer is deposited for texturing purposes, and contributes to island formation by having a different composition than the island layer. In some embodiments, the base layer 112 can be monocrystalline and p-doped and have a doping concentration in a range of about $5\times10^{17}$ cm$^{-3}$ to about $2\times10^{19}$ cm$^{-3}$. The base layer 112 and island layer are described in greater detail below. In some other embodiments, the base layer 112 is not included in the device 100. For example, the island layer (described below) can be deposited on the emitter layer 110 having a different lattice parameter than the island layer, or on the absorber layer 108 if positioned above the emitter layer.

Figure 2A:
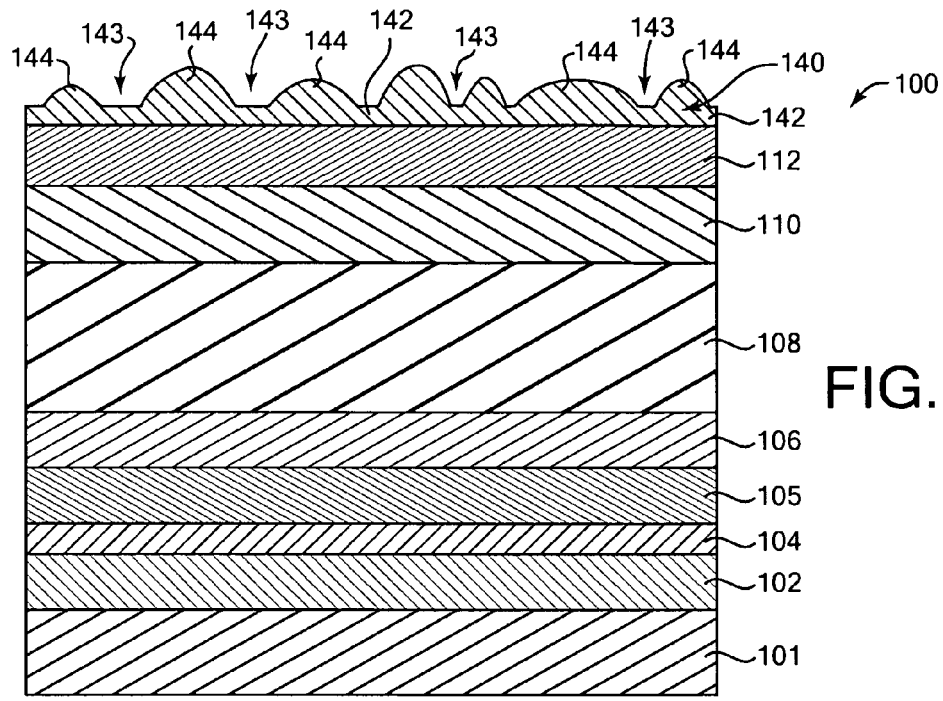
FIGS. 2A and 2B depict cross-sectional views of the photovoltaic device of FIG. 1 in which an island layer has been deposited over a base layer.

FIG. 2A is a cross-sectional view of the photovoltaic device 100 including a deposition of an island layer 140 on the base layer 112 according to one embodiment of a textured layer for use as a back reflector. The island layer 140 is created using an island-growth process and includes islands for texturing one or more surfaces of the island layer to cause light reflection and scattering in the device, increasing light trapping.

Figure 2B:
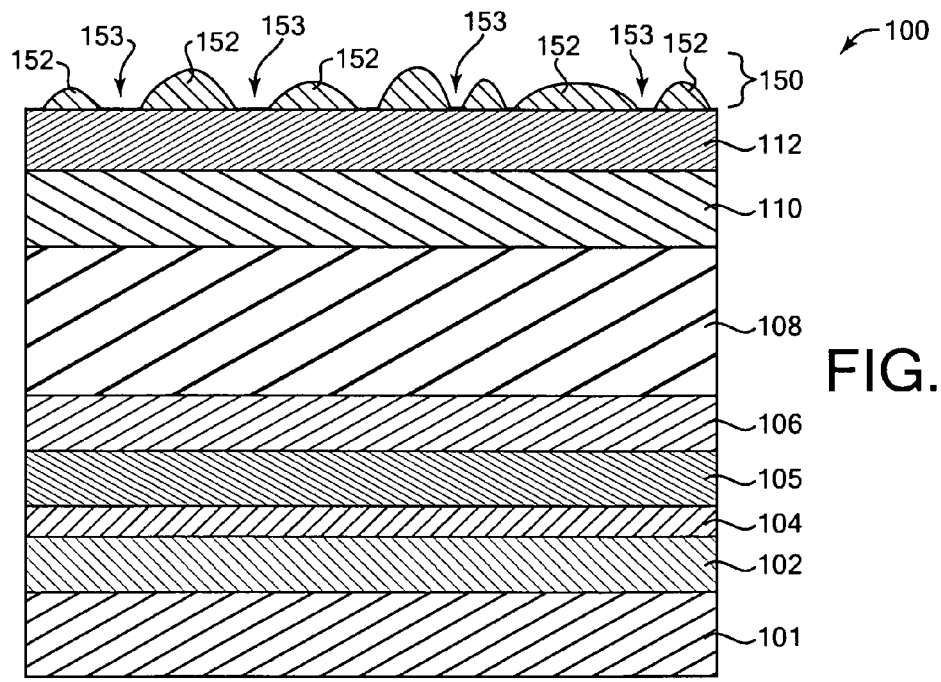

The island growth process used can vary in different embodiments. In general, island growth process embodiments described herein use, at least in part, strain between different materials caused by a lattice mismatch to promote growth of the islands. For example, in some embodiments, such as the example embodiment shown in FIG. 2A, the Stranski-Krastanov process can be used to form the island layer 140. This process involves depositing a particular material, which first forms a wetting layer 142 of the island layer material (which can include one more individual layers), followed by forming islands 144 of the same material on the wetting layer 142. In other embodiments, other types of island growth processes can be used. For example, FIG. 2B shows the formation of islands using a Volmer-Weber process which may not provide a wetting layer of the island layer material on which the islands grow, as described below.

The island layer 140 can comprise a semiconductor material, and is a different material than the material of the base layer 112 upon which the island layer 140 is deposited. In some embodiments, the island layer 140 can be a material having a larger band gap than the material of the base layer 112. In some examples, the island layer 140 can comprise phosphorus, gallium, aluminum, indium, arsenic, antimony, nitrogen, derivatives thereof, and/or combinations thereof. For example, in some embodiments, the base layer 112 can comprise gallium arsenide (GaAs) or aluminum gallium arsenide (AlGaAs), and the island layer 140 can comprise indium gallium arsenide (InGaAs) or gallium arsenide antimonide (GaAsSb). In other embodiments, the base layer 112 can comprise aluminum gallium arsenide (AlGaAs) and the island layer 140 can comprise gallium phosphide (GaP). In other embodiments, the base layer 112 can comprise indium arsenide (InAs) and the island layer 140 can comprise indium arsenide antimonide (InAsSb). In still other embodiments, the base layer 112 can comprise gallium indium phosphide (GaInP) and the island layer 140 can comprise gallium phosphide (GaP) or aluminum phosphide (AlP). In still other embodiments, the base layer 112 can comprise indium phosphide (InP) and the island layer 140 can comprise indium phosphide antimonide (InPSb). In some embodiments, the island layer can comprise gallium indium nitride arsenide (GaInNAs), gallium nitride arsenide (GaNAs), gallium arsenide phosphide (GaAsP), aluminum gallium arsenide phosphide (AlGaAsP), or aluminum gallium phosphide (AlGaP). In any of these embodiments, derivatives and/or combinations of these materials can be used. Some embodiments can use a material for island layer 140 that is doped; for example, the material can be p-doped, and can have a doping concentration in a range of about $1 \times 10^{17}$ cm$^{-3}$ to about $2 \times 10^{19}$ cm$^{-3}$, such as about $1 \times 10^{18}$ cm$^{-3}$.

In some embodiments, the island layer 140 comprises a material that has an index of refraction (n) and an absorption (k) that increases or maximizes the ability to scatter or reflect light. For example, island layer 140 can comprise a transparent material to allow light to pass through the island layer. The term "transparent" as used herein refers to a negligible amount of absorption in the wavelength range of operation of the optoelectronic device. For example, in some embodiments the island layer 140 can have an index of refraction in a range of about 1 to about 3.5. Furthermore, in some embodiments the material of the island layer 140 can have an absorption (k) in a range of about 0 to about $1 \times 10^{-2}$, such as about $1 \times 10^{-3}$ or about $1 \times 10^{-4}$. In some embodiments, the island layer 140 may comprise multiple transparent layers.

In some embodiments, various parameters of the deposition process may be changed or tuned for the deposition of the island layer 140, as compared to the deposition parameters used during deposition of previous layers such as the base layer 112. For example, the temperature, pressure, deposition gas, and/or growth rate of the deposition process can be changed, as described in greater detail below.

In FIG. 2A, the wetting layer 142 and islands 144 have been deposited on the base layer 112 using a Stranski-Krastanov process. The wetting layer includes complete films of adsorbates accumulated on a substrate, where the substrate is the base layer 112 in the described example. The wetting layer 142 can be grown with deposited material until a particular thickness is achieved, after which further deposition causes one or more islands 144 to grow. Islands 144 are thus comprised of the same material as the wetting layer 142. Once the wetting layer 142 has achieved a critical thickness in the Stranski-Krastanov process, as determined by the chemical and physical properties of the wetting layer 144 and base layer 112, continued growth of the adsorbate on the base layer 112 occurs through the accumulation of the islands 144 on the wetting layer 142 due to strain or stretch in the wetting layer material.

The islands 142 provide a textured surface of the island layer 140. The growth of the islands 142 is controlled to increase or maximize the angle randomization of light impinging on or transmitting through the island layer 144. This angle randomization of light can be increased or maximized by tuning or tailoring different parameters of the growth conditions, and therefore the growth, of the islands 144 so that the islands obtain particular characteristics. Some of the different parameters include the amount of material deposited for the island layer, the deposition temperature, deposition pressure, growth rate of the island layer material, Group V element flow in the deposition gas, and composition of the island material to affect the lattice mismatch between the base layer and island layer materials.

The amount of island layer material deposited can affect island growth. For example, greater amounts of material deposited tends to encourage Stranski-Krastanov island growth over Volmer-Weber island growth (described in greater detail below).

Another parameter that can be selected to control the growth of the islands 144 includes the temperature provided during the deposition process of the island layer 140. For example, the temperature can be made higher to create islands 144 having larger dimensions. Some examples of temperature ranges used for depositing the island layer 140 include about 600° C. to about 900° C.

Another parameter for controlling the growth of the islands 144 is the pressure provided during the deposition of the island layer 140. For example, the pressure can be made greater to create islands 144 having smaller dimensions. Some examples of pressure ranges that can be used for depositing the island layer 140 include about 50 Torr to about 600 Torr.

Another parameter is the growth rate of the island layer 140 which can be controlled to affect textured layer characteristics. For example, in some embodiments using the Stranski-Krastanov process, the growth rate of the island layer 140 can be controlled to be faster than in standard, prior uses of the Stranski-Krastanov process. In one example, the growth rate can be controlled to be in accordance with the high growth rates of the other layers deposited for the photovoltaic device 100 as described above for the epitaxially grown layers. In other embodiments, the islands 144 can be grown more slowly, e.g., if in some embodiments better control over particular features of the islands are desired, such as facets. In some examples, a range of growth rates of greater than about 5 µm/hr for the island layer 140 material can be used.

Another parameter that can be controlled is the Group V element flow in the deposition gas provided during deposition. For example, the deposition gas for forming the island layer 140 can have a ratio of Group V precursor to Group III precursor. In some embodiments, the Group V element is phosphine. This flow ratio can be controlled to tune the island growth to desired characteristics. In general, for example, the phosphine flow ratio can be reduced (i.e., lower ratio provided) relative to the flow ratio used for the previously-deposited layer (e.g., the base layer 112) to promote islands to form. In some embodiments, the deposition gas can have a phosphine/Group III precursor in a range of about 50:1 to about 300:1.

Another parameter that can be selected to control the growth of the islands 144 is the composition (types) of materials used in the base layer 112 and the island layer 140. For example, materials can be selected based on the lattice parameters of the material of the contact layer 112 and of the material of the island layer 140. In general, the growth of the islands 142 depends in part on the lattice misfit between the base layer 112 and the island layer 140. For example, in a Stanski-Krastanov process, a greater mismatch between lattice parameters leads to smaller critical thicknesses of the wetting layer 142 at which point island growth starts to occur. The lattice parameters of the material of the base layer 112 and of the material of the island layer 140 can be selected to provide desired growth patterns or features of the islands 144, such as the form of the islands, the point at which the islands start growing after a wetting layer deposition, etc. In some example embodiments, a lattice mismatch in a range of about 3% to about 20% between the materials of the base layer 112 and the island layer 140 can be used. In some embodiments, the island layer 140 can be a material having a larger bandgap than the material of the base layer 112.

The islands 144 can be controlled to have particular or general physical characteristics, such as regular or irregular shape, dimensions and/or spacing. For example, island geometries and sizes can be controlled by controlling growth rate of the wetting layer and/or islands, controlling the critical thickness, using a textured or patterned base layer 112, etc.

In addition, the islands 144 can have a particular degree of variation or irregularity in some or all of their physical characteristics (e.g., dimensions, shape, and/or spacing) to provide varying, non-uniformly-shaped and non-uniformly-spaced islands 144. Such variation and randomized texture generally increases the ability to randomly scatter light received by the island layer into the absorber layer 108 as compared to a uniform texture.

Since the textured layer including island layer 140 is formed as a non-active scattering layer having islands not provided within an absorber layer or emitter layer and exploits the shapes formed using an island growth deposition process, and since a greater degree of variation, irregularity or randomness is preferred in island 144 formation, a high-quality semiconductor is not necessary as the material of the island layer 140 in some embodiments. This can allow some reduction in cost of materials and/or processing compared to previous uses of island growth processes such as the Stranski-Krastanov process, in which precisely-dimensioned and precisely-spaced islands were grown in absorber layers of a device (e.g., for tuning wavelength emissions in semiconductor lasers). In addition, the use of lesser-quality semiconductors can allow higher growth rates of the island layer 140 in some embodiments.

FIG. 2B is a cross-sectional view of the photovoltaic device 100 including a deposition of an island layer 150 suitable for some embodiments disclosed herein, in which the islands are formed using a different island growth process. In FIG. 2B, a Volmer-Weber growth process has been used for island growth instead of the Stranski-Krastanov process used in the example of FIG. 2A.

Island layer 150 includes islands 152 which have been formed by depositing island layer material on the base layer 112 (or other layer in embodiments not having a base layer 112, as described above). Unlike the island layer 140 of FIG. 2A, the example island layer 150 does not include a wetting layer deposited before the islands form. The islands 152 form due to atoms on the surface of the base layer 112 having stronger interactions with the atoms of the island material than with the surface of the base layer. This causes clusters of material or islands 152 to form as the island material is deposited. Thus, some or all islands 152 may be formed directly on the surface of the base layer 112, and/or some or all islands 152 may have a layer of island material formed between the base layer 112 surface and the islands 152. Volmer-Weber island growth typically occurs at higher lattice mismatches between island layer and base layer, and on lower thicknesses of the island layer, compared to the Stranski-Krastanov growth described above. For example, Volmer-Weber island growth may occur at below about 5 angstroms thickness of the island layer in some embodiments.

Island layer 150 comprises a semiconductor material, and is a different material than the material of the base layer 112 upon which the island layer 150 is deposited. For example, in some embodiments, the island layer 150 can comprise phosphorus, gallium, aluminum, indium, arsenic, antimony, nitrogen, derivatives thereof, and/or combinations thereof. In some embodiments, the base layer 112 and island layer 150 can combinations or derivatives of materials of the materials described above for island layer 140. Some embodiments can use a material for island layer 150 that is doped.

Similarly as explained above for the embodiment of FIG. 2A, the growth of islands 152 can be controlled by tuning one or more various parameters of the deposition process, including the parameters described above.

Figure 3:
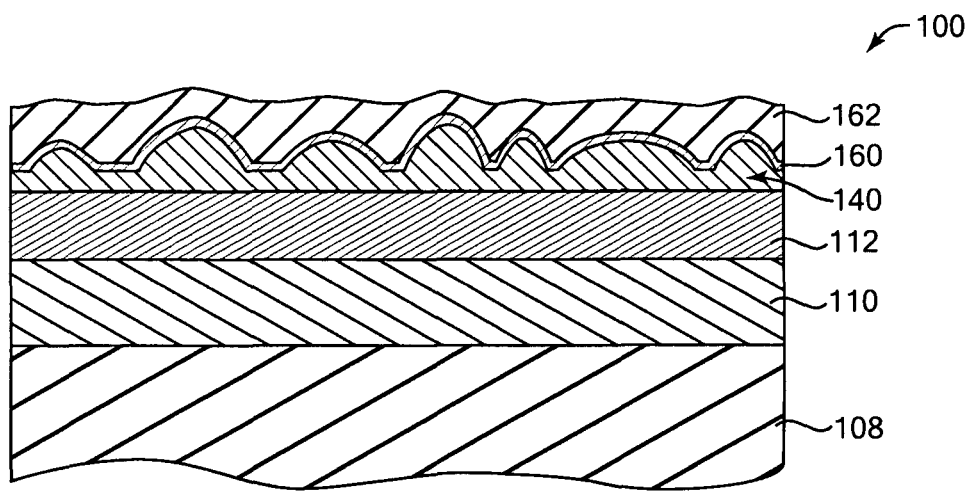
FIG. 3 depicts a cross-sectional view of the photovoltaic device of FIG. 2 in which a semiconductor contact layer and dielectric layer have been deposited over the island layer.

In FIG. 3, the photoelectric device 100 has been further developed by depositing an optional semiconductor contact layer 160 over the island layer 140 or 150, followed by depositing a dielectric layer 162 over the contact layer (if present) or over the island layer 140 or 150 (if contact layer 160 is not present). Island layer 140 is shown in the example Figures described below, where island layer 150 can be used in place of island layer 140 as desired.

The semiconductor contact layer 160 can be deposited in some embodiments to, e.g., provide a cap on the island layer and to allow other layers to be more easily deposited over the island layer, and/or to provide a better ohmic contact for charge carrier movement in the device 100. In some example embodiments, the contact layer 160 can be comprised of a semiconductor such as gallium arsenide (GaAs) (e.g., with lower thicknesses since it can be less transparent), aluminum gallium arsenide (AlGaAs) (e.g., with higher thicknesses since it can be more transparent), or other materials, and can be p-doped in some embodiments, having a thickness in a range of about 5 nm to about 500 nm.

Dielectric layer 162 can be deposited over the contact layer 160 and/or the island layer 140 or 150 in some embodiments, and can boost the reflection or scatting of light impinging on or traveling through the island layer 140 or 150. In some examples, the dielectric layer 162 can comprise an insulating material such as silicon dioxide ($SiO_2$), e.g., having a dielectric constant between the island semiconductor material and 1. In some embodiments, the dielectric layer 162 can be of a thickness of one-quarter wavelength (or multiple thereof) of the light intended to be scatted by the textured layer, and allows greater reflecting ability than only using a metal layer (described below). In some embodiments, the dielectric layer can have a lower refractive index n than the island layer 140 or 150.

Thus, the islands 144 or 152 can form recesses in the layer(s) deposited above the islands, such that in a back reflector embodiment, light traveling through the material of the island layer 140 or 150 impinges on and reflects off (e.g., is scattered by) the surfaces of the recesses. Some examples are shown in greater detail with respect to FIG. 9.

In some other embodiments, a different material can be deposited instead of dielectric layer 162 over the semiconductor layer 160 or over the island layer 140 or 150 (if contact layer 160 is not present). For example, in some embodiments, a transparent conducting oxide (TCO) layer can be deposited to provide boosted reflection abilities similar to a dielectric layer, and also provide a conductive path for charge carriers between the island layer and a conductive metal layer provided over the TCO layer. In these embodiments, apertures such as described for the dielectric layer 162 in FIG. 4 may not need to be formed in the TCO layer. In some embodiments, a high-resistivity transparent (HRT) layer can also be provided between the TCO layer and a semiconductor layer (such as island layer 140/150, emitter layer 110, or absorber layer 108). The HRT layer can reduce shunting of charge carriers through pin holes in the semiconductor material.

Figure 4:
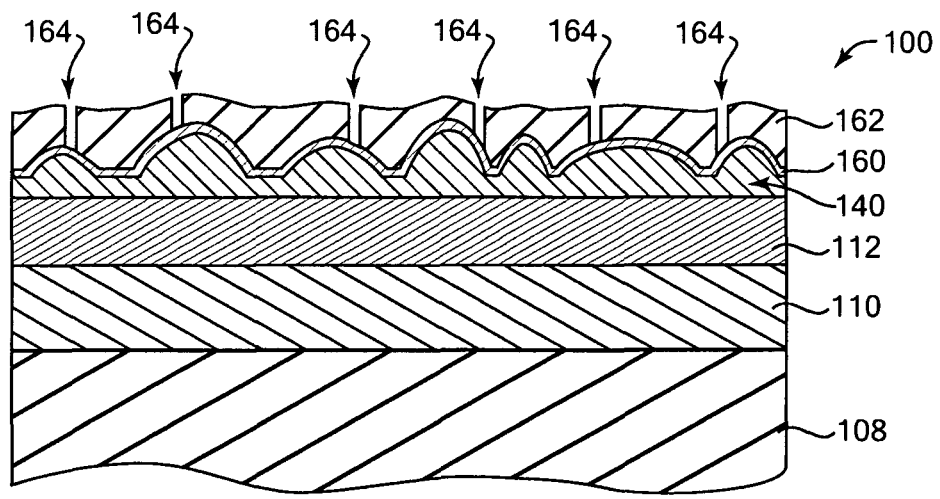
FIG. 4 depicts a cross-sectional view of the photovoltaic device of FIG. 3 in which apertures have been formed in the dielectric layer.

FIG. 4 illustrates the device 100 after apertures have been formed in the dielectric layer 162 to allow a conductive contact through the dielectric layer 162. In embodiments having the semiconductor contact layer 160, such as the example embodiment shown in FIG. 4, apertures 164 are formed through the dielectric layer 162 from the surface of the dielectric layer 162 to the semiconductor contact layer 160. In other embodiments having no semiconductor contact layer 160, the apertures 164 can be formed from the surface of the dielectric layer to the island layer 140 or 150.

In some embodiments, the apertures 164 are formed by etching using an etching process. The etching process can be performed using any of available suitable techniques.

Figure 5A:
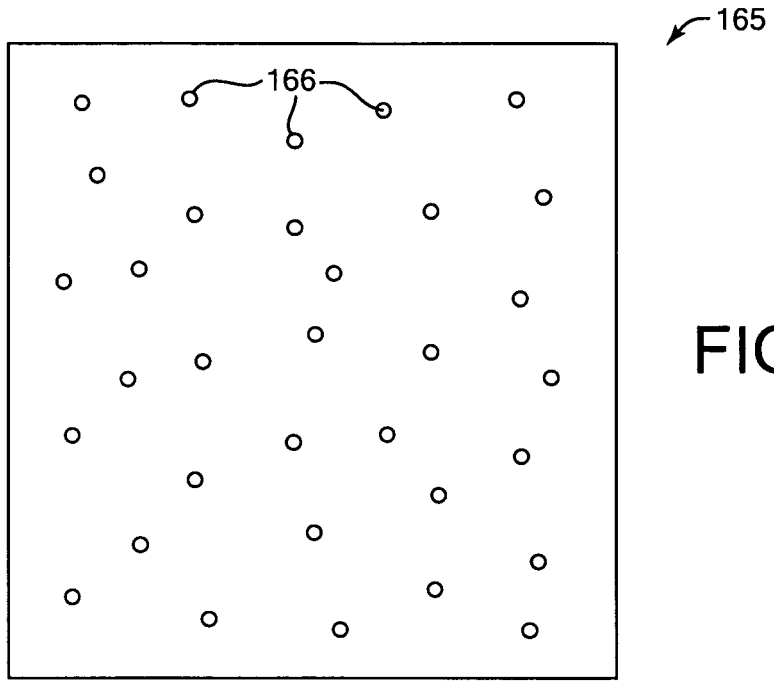
FIGS. 5A and 5B depict top plan views of different embodiments of masks which can be used to form apertures in the dielectric layer shown in FIG. 4.
Figure 5B:
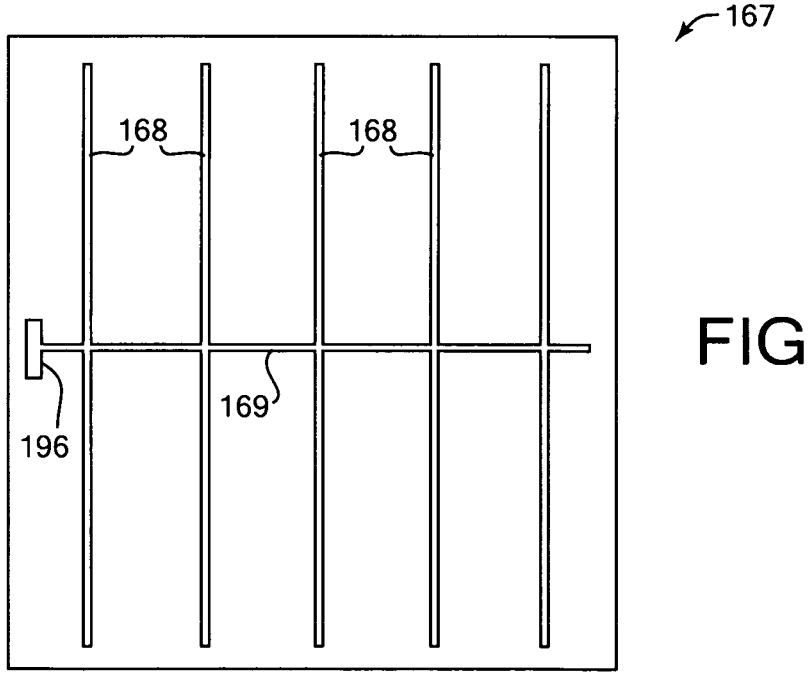

In some example embodiments, a particular pattern of apertures 164 in the dielectric layer 162 can be provided with a mask such as a photoresist/etching mask. FIG. 5A shows one example of a top view of a mask pattern 165 providing apertures 164 in the dielectric layer 162, in which the apertures are circular holes 166 having an approximately circular cross section (approximately circular in the top view of FIG. 5A). FIG. 5B shows another example of a top of view of a mask pattern 167 providing apertures 164 in the dielectric layer 162, in which the apertures are linear grooves. One or more grooves 168 can intersect one or more other grooves 169 as shown. The grooves can be positioned approximately parallel and/or perpendicular to each other as shown, or can be positioned at various other angles in other embodiments. Non-linear or irregular grooves can be used in other embodiments.

Figure 6:
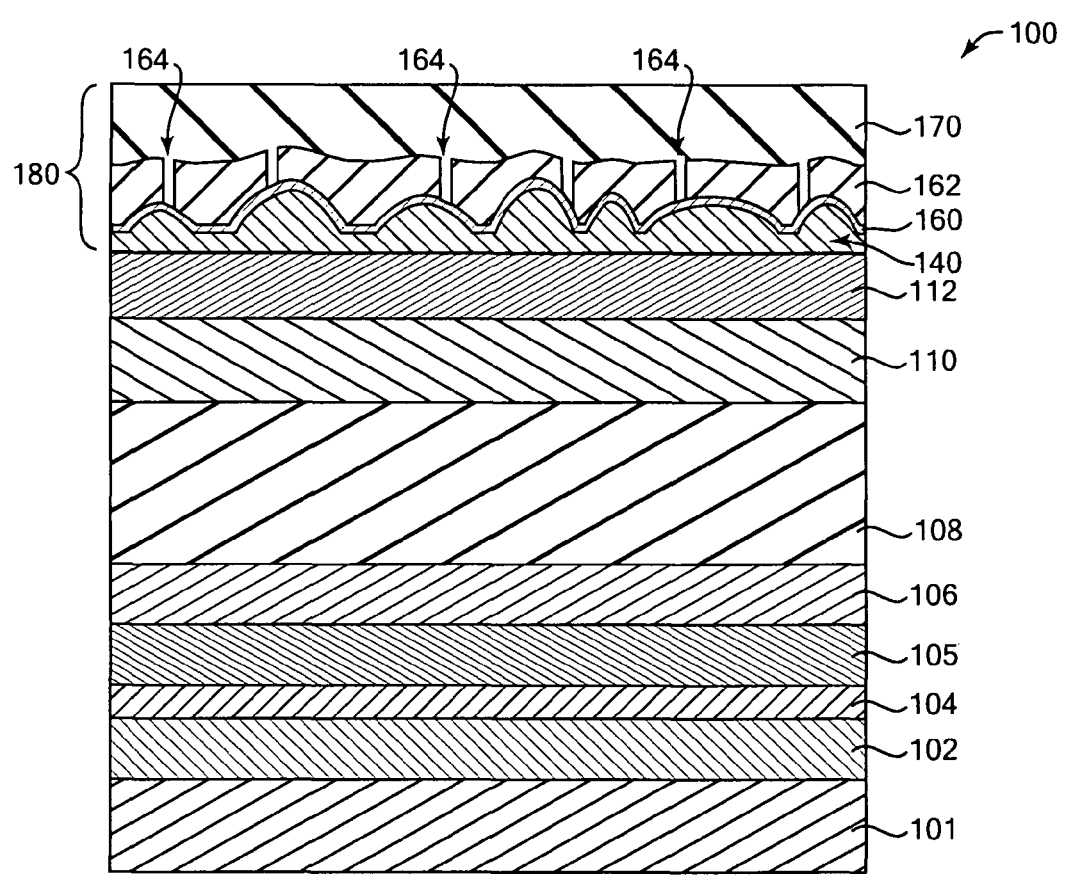
FIG. 6 depicts a cross-sectional view of the photovoltaic device of FIG. 4 in which a metal layer has been deposited on the dielectric layer.

In FIG. 6, the photoelectric device 100 has been further developed by depositing a reflective back metal layer 170 over the dielectric layer 162, providing one example of a textured layer 180. The metal layer 170 comprises a metal that reflects light efficiently. For example, in some embodiments the metal layer 170 can be comprised of gold, silver, copper, or other reflective metals, derivatives thereof, and/or combinations thereof. The deposition of the metal layer 170 provides an approximately flat surface opposite to the island layer 140 or 150. In some embodiments, the metal layer 170 can have an average thickness in a range of about 70 nm to about 10 The material of the metal layer 170 also is deposited into the apertures 164 so that a conductive contact is made between the metal layer 170 and the semiconductor contact layer 160, or between the metal layer 170 and the island layer 140 or 150 if no contact layer 160 is present. In some other embodiments, the metal layer 170 can be deposited over the island layer 140 or 150 without having a dielectric layer 162 and/or a semiconductor contact layer 160 deposited between the metal and island layers.

Figure 7:
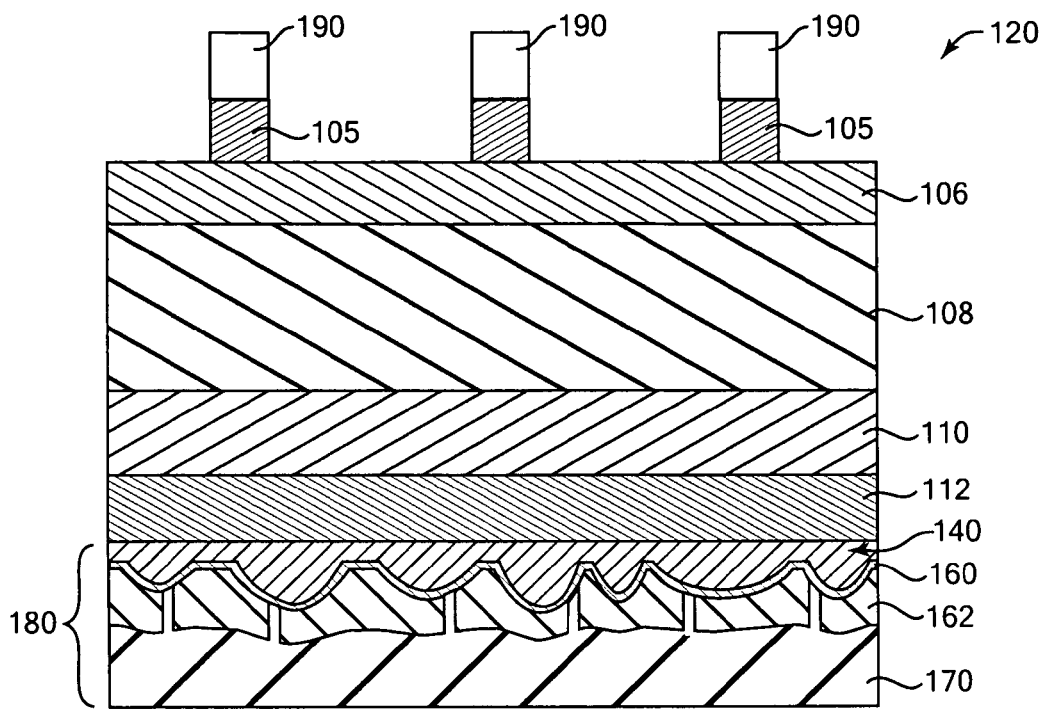
FIG. 7 depicts a cross-sectional view of one embodiment of a photovoltaic cell resulting from the photovoltaic device of FIG. 6 after a lift-off process.

In FIG. 7, the photovoltaic cell 120 is shown flipped over in orientation after a lift-off process has removed some of the layers shown in previous steps in FIGS. 1-6. Once the epitaxial layers have been formed for the PV device 100 as shown in FIG. 6, some layers of the photovoltaic device 100, such as the front contact layer 105, window layer 106, absorber layer 108, emitter layer 110, and textured layer 180 can be separated from substrate 101 and any buffer layer(s) 102 during an ELO process.

In one example, the photovoltaic device 100 may be exposed to a wet etch solution in order to etch the sacrificial layer 104 and to separate the cell 120 from the growth wafer 101 during an epitaxial lift off (ELO) process. FIG. 7 shows the cell 120 in its resulting orientation, with the front of the cell 120 oriented at the top of the cell, where light impinges on and enters the cell. The textured layer 180 thus acts as a back reflector at a position further from the front of the cell 120 than the p-n junction formed by the absorber and emitter layers. Once separated, the cell 120 may be further processed to form a variety of photovoltaic devices, including photovoltaic cells and modules. For example, metal contacts 190 can be deposited on the front contact layer 105.

Figure 8:
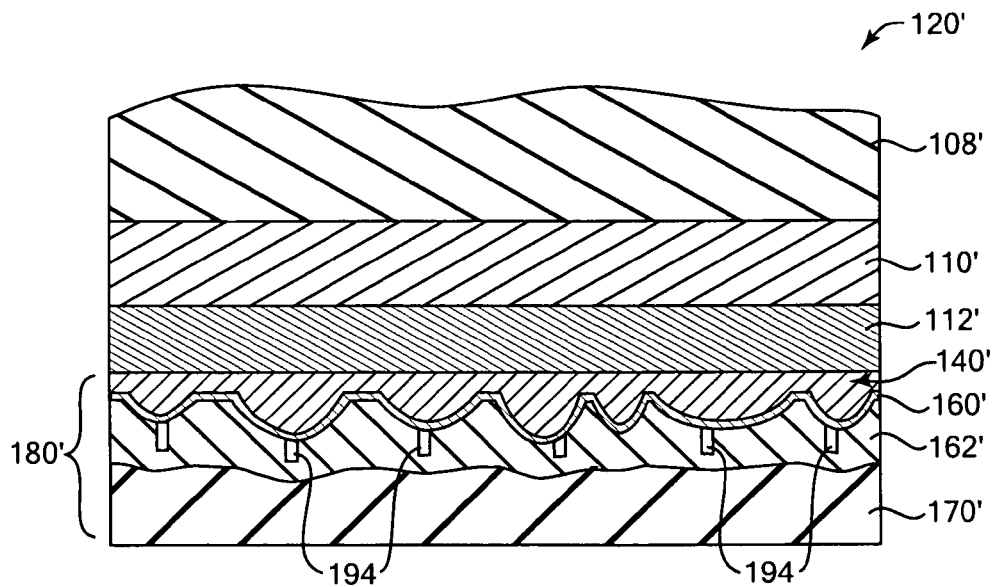
FIG. 8 depicts a cross-sectional view of another embodiment of a photovoltaic cell resulting from the photovoltaic device of FIG. 2A.

FIG. 8 illustrates a cross-sectional view of an alternate embodiment 120' of the photovoltaic cell 120 in which apertures are not formed in the dielectric layer 162, and conductive contacts are deposited under the dielectric layer 162. In this example, during layer deposition, a number of conductive contacts 194 can be deposited on the semiconductor contact layer 160', or on the island layer 140'/150' if no contact layer 160' is present. A dielectric layer 162' is deposited over the contacts 194 and the semiconductor contact layer 160'. A metal contact layer 170' is deposited over the dielectric layer 160'. The device is then flipped over to the orientation shown in FIG. 8 after an ELO or similar process.

The conductive contacts 194 are shown in cross section, and can extend into or out of the plane of FIG. 8 to one or more locations (not shown) to be routed through the dielectric layer 162' to the metal contact layer 170'. For example, in some embodiments, the contacts 194 can be configured similarly to grooves 168 and 169 of the mask pattern 167 shown in FIG. 5B, where the contacts 194 extend over an area of the cell 120' and are connected to one or more connection nodes (e.g., similar to node 196 shown in FIG. 5B) that extend through the covering portion of the dielectric layer 162' to the metal contact layer 170', or extend to a location outside the cell 120'. Embodiments providing metal contacts 194 can avoid the etching of apertures in the dielectric layer, saving process steps in the formation of the cell 120'.

Figure 9:
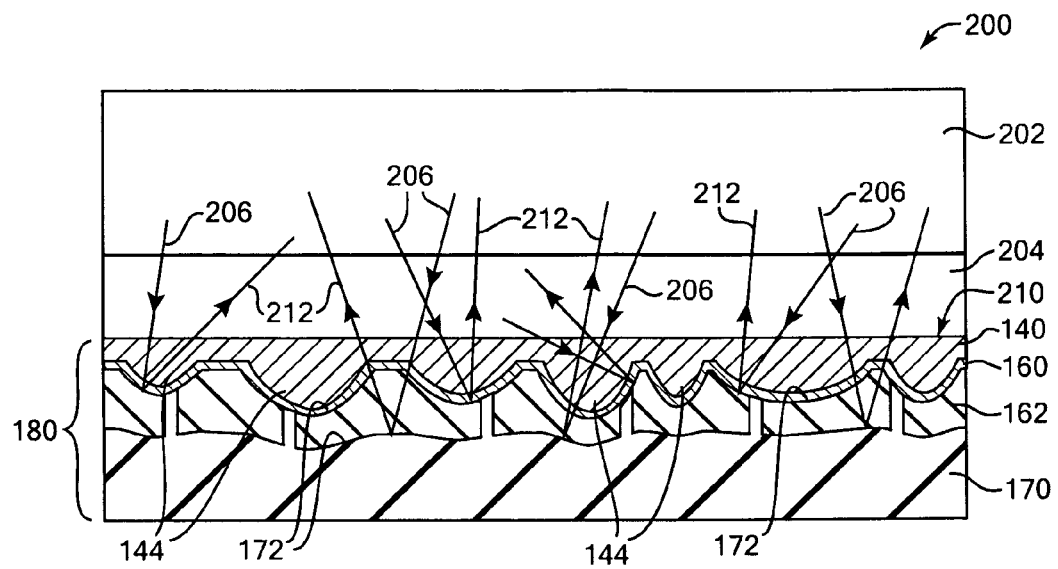
FIG. 9 depicts a cross-sectional view of a photovoltaic cell illustrating scattering of light by a textured layer on a back side of a device.

FIG. 9 shows a diagram illustrating a portion 200 of the photovoltaic cell 120 of FIG. 7, and in which light is received by the textured layer 180 acting as a back reflector layer. An active layer or region 202 is provided over a textured reflector layer 180. For example, the active layer 202 can be a solar cell active region such as an emitter layer 110 and/or absorber layer 108. One or more other layers 204 can also be positioned between the active layer 202 and the textured layer 180 in some embodiments.

Light 206 has traveled into the photovoltaic cell 120 and has not been absorbed by the upper layers. This light 206 emerges from the active layer 202 and impinges on the front surface 210 of the textured layer 180. The light 206 passes through the transparent material of the island layer 140. Some of the photons 206 may hit a surface of the dielectric layer 162 and are reflected from that layer. Other photons 206 may pass through the dielectric layer 162 and may hit a surface of the back metal layer 170 and are reflected from that layer. The reflected photons are directed back through the island layer 140 and then into the active layer 202 as indicated by arrows 212, where they can "bounce around" and may be captured by the absorber layer 108 and emitter layer 110 and further generate current in the cell.

The islands 144 of the island layer 140 (or islands 152 of island layer 150) create recesses 172 in the dielectric layer 162 and the back metal layer 170. This creates a randomized, roughened, and angled front surface of the dielectric layer 162 and the back metal layer 170. The textured layer 180 diffuses or scatters photons that pass through the active layer 202 without being absorbed. The texturing of the textured layer 180 can provide new angles to incident photons, some of which may be redirected back through the island layer 140 or 150 and towards the interior of the photovoltaic cell. Although some of the light may be absorbed by the island layer as the photons are scattered and redirected inside, much of the light is redirected to the active layer 202. The different angles on the surfaces of the textured layer 180 and its recesses 172 thus effectively cause the photons 206 to reflect at random angles back into the active layer 202 to allow a greater amount of them to be recaptured by the active layer and converted into electrical energy, thereby increasing the light trapping properties of the cell 120 and increasing efficiency.

Figure 10:
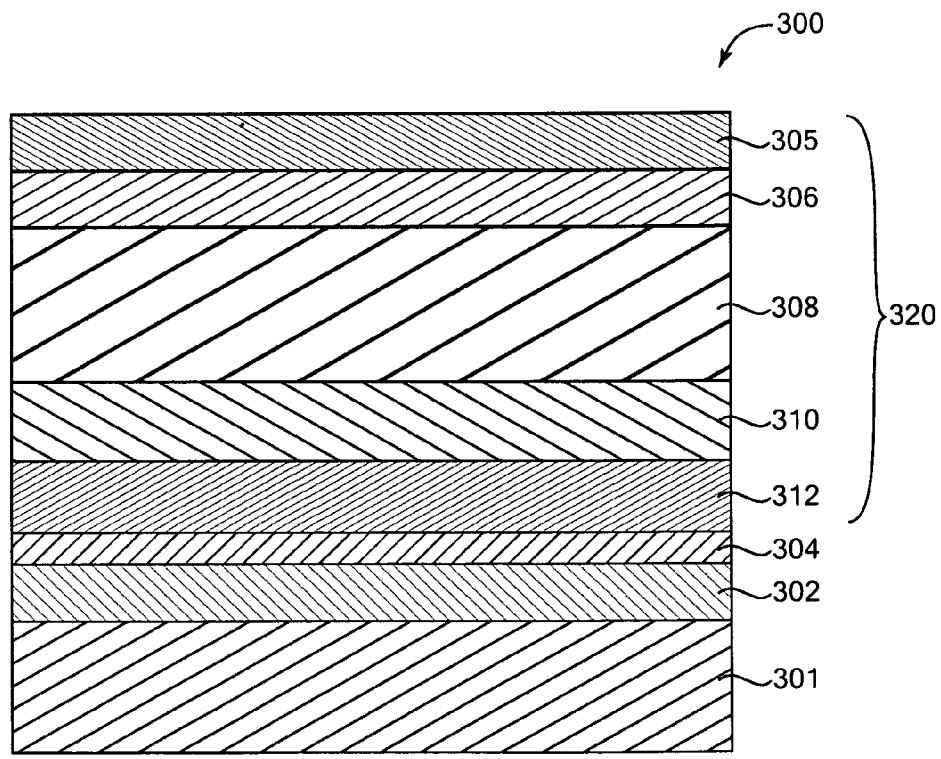
FIG. 10 depicts a cross-sectional view of a photovoltaic device in accordance with some embodiments described herein providing a front side light trapping textured layer.

FIG. 10 is a cross-sectional view of another embodiment of a photovoltaic device 300 suitable for providing a textured layer at a front side of the device. A textured layer can be provided for light trapping at the front side of a photovoltaic cell instead of, or in addition to, the back-side light trapping described above. This allows light impinging on the front side of the photovoltaic device to become scattered in the device by a textured surface created by the textured layer, increasing light trapping in the device.

Photovoltaic device 300 includes a cell 320 coupled with a growth wafer 301 by an ELO release layer or sacrificial layer 304 disposed therebetween. In some embodiments, one or more buffer layers 302 may be formed on the growth wafer 301 in order to start forming the photovoltaic device 300. Layers of the photovoltaic cell 320 can be deposited over the sacrificial layer 304, which in some embodiments can include a back semiconductor contact layer 312, an emitter layer 310 over the back contact layer 312, an absorber layer 308 over the emitter layer 310 (or emitter layer 310 over the absorber layer 308), a front window or passivation layer 306 over the absorber layer 308, and a base layer 305 for texturing, provided over the window layer 306.

In some embodiments, the back contact layer 312 can be comprised of a non-metal Group III-V compound semiconductor, such as gallium arsenide.

Base layer 305 for texturing is similar to base layer 112 described above with reference to FIG. 1. For example, the base layer 305 provides a first layer on which an island layer is deposited for texturing purposes, and contributes to island formation by having a different composition (e.g., different lattice parameter) than the island layer.

In other embodiments, the device 300 is not grown on a sacrificial or ELO release layer structure as shown. For example, in other embodiments the device 300 is not included an ELO lift-off procedure and is grown on a substrate without the sacrificial layer 104 or buffer layers 302.

Figure 11:
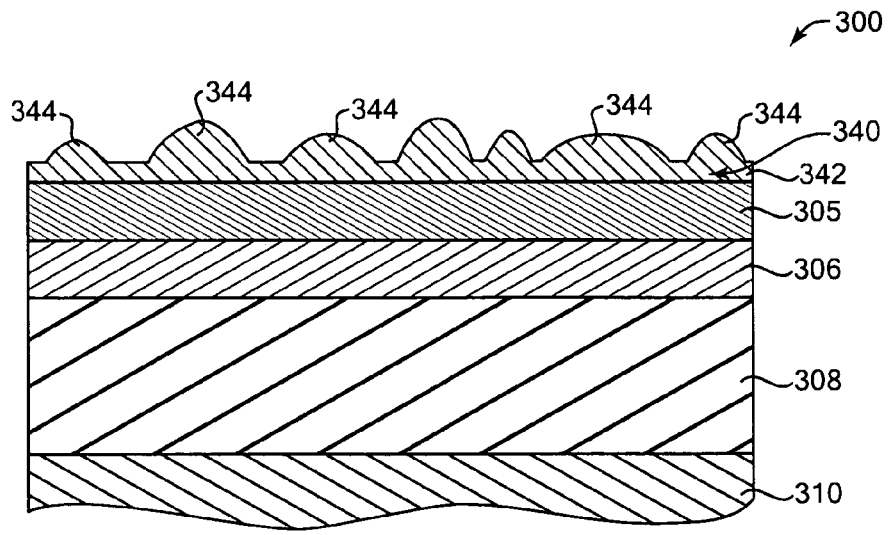
FIG. 11 depicts a cross-sectional view of the photovoltaic device of FIG. 10 in which an island layer has been deposited over a base layer.

FIG. 11 is a cross-sectional view of the photovoltaic device 300 including a deposition of an island layer 340 on the base layer 305 according to one embodiment of a textured layer for use as a front side light trapping layer. The island layer 340 is created using an island-growth process and provides islands 344 for texturing one or more surfaces of the island layer to cause light reflection and scattering in the device, increasing light trapping. Some embodiments may include a wetting layer 342, similarly as described above.

Figure 12:
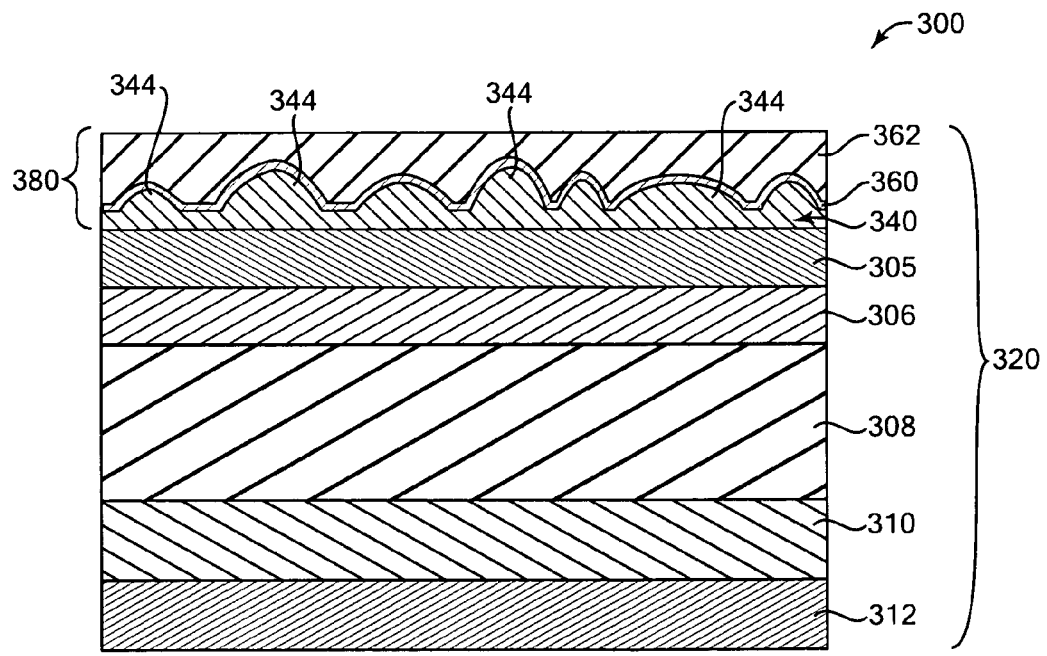
FIG. 12 depicts a cross-sectional view of the photovoltaic device of FIG. 11 in which layers have been deposited over the island layer.

In FIG. 12, the photoelectric device 300 has been further developed by depositing layers over the island layer 140. In some embodiments, as in the example shown in FIG. 12, an optional semiconductor contact layer 360 is deposited over the island layer 340.

An anti-reflective coating (ARC) 362 can be deposited over the semiconductor contact layer (if present) or over the island layer 340 (if contact layer 360 is not present). The ARC layer 362 comprises a dielectric material that allows light to pass through while preventing light reflection from the surface of the ARC layer 362. In some embodiments, the ARC layer 362 can comprise multiple layers.

In ELO embodiments, the cell 320 (including layers 340, 360, and 362) can be removed from the ELO layers 301, 302, and 304 using an ELO process. After removal, the cell 320 retains its orientation shown in FIGS. 10-12 and is not flipped over in orientation as for the back side reflector embodiment described above. In other embodiments, no ELO process is used for the cell 320.

The layers 340, 360, and 362 provide a front side light-trapping textured layer 380. The front side location of the textured layer 380 allows it to receive light impinging on the device 300 and scatter the light at different angles into the lower layers of the device 300 due to the textured, randomized surfaces of the islands in the island layer 340. This promotes light trapping as the photons bounce within the lower layers, allowing more of them to be absorbed to generate current.

In other embodiments of devices 100 and 300, other layer arrangements, doping arrangements, layer thickness, etc. can be used. For example, the emitter layer can be deposited over the absorber layer in some embodiments.

Embodiments of optoelectronic devices and methods to provide such devices described herein can provide a textured layer including islands created for a textured surface allowing increased light trapping. Disclosed embodiments also can provide advantages over previous light trapping layer formation techniques, including greater flexibility, reduced cost, and increased layer growth rate, saving time and expense in the manufacture of devices.

For example, some previous light trapping techniques form a textured surface by using one or more etch processes, such as wet or dry etching. A thermal treatment can also be used to "cure" the patterned textured surface. Such etching and curing techniques can add significant time and processing to the manufacture of photovoltaic devices, and some etching techniques can introduce defects into the materials of other layers such as semiconductor layers, reducing the efficiency of resulting photovoltaic devices and their manufacture. Embodiments disclosed herein can introduce fewer defects in the layers of photovoltaic devices than such previous techniques. For example, in the described processes the formation of the islands is performed via deposition rather than an etchant, and does not require separate and time-consuming etching steps to form the islands, leading to greater efficiency in manufacture of the device. In addition, since no material is being removed and wasted when forming the islands as in etching processes, the cost of the materials for the device is reduced.

The island growth processes described herein also are more flexible and lower cost than some other previous texturing processes using controlled growth of grains. In such techniques, the growth of grains or crystals in a polycrystalline semiconductor absorber layer is controlled, where smaller grains provide better light scattering than larger grains, but larger grains are more efficient for current generation. The grain size thus must be carefully determined and the grain growth carefully controlled to a particular size, making the technique difficult and costly to perform. In contrast, processes herein can use a wider variety of materials, including higher-efficiency monocrystalline semiconductors. Furthermore, the processes herein allow island formation in a layer other than the absorber layer, as well as allowing a more flexible range of island sizes and spacing than the precisely-controlled grain sizes in prior techniques, allowing faster and less-costly manufacture of devices.

Although inventions have been described in accordance with the embodiments shown, one of ordinary skill in the art will readily recognize that there could be variations to the embodiments and those variations would be within the spirit and scope of the inventions. Accordingly, many modifications may be made by one of ordinary skill in the art without departing from the spirit and scope of the appended claims.

What is claimed is:

1. A method for providing a textured layer in a photovoltaic device, the method comprising:
   sequentially performing the steps of:
      depositing a first layer of a first material on a substrate;
      then depositing an island layer of a second material on the first layer, the depositing of the island layer including:
         forming one or more islands of the second material to provide at least one textured surface of the island layer, wherein the at least one textured surface is operative to cause scattering of light;
      then depositing a third layer of a third material, wherein the third layer further comprises any of a dielectric layer, a semiconductor contact layer, a transparent conductive oxide layer and a combination thereof; and
      then lifting the device off the substrate, such that after the lift off the first layer is closer than the island layer to a light facing side of the device; wherein the device comprises the first layer, the island layer and the third layer.

2. The method of claim 1 wherein the one or more islands are formed using a Stranski-Krastanov process.

3. The method of claim 1 wherein the one or more islands are formed using a Volmer-Weber process.

4. The method of claim 1 wherein the second material is transparent.

5. The method of claim 1 further comprising depositing a metal reflective layer over the third layer.

6. The method of claim 5, wherein the dielectric layer is provided with apertures allowing a conductive contact between the metal reflective layer and the semiconductor contact layer or the island layer.

7. The method of claim 5 wherein the textured layer is a back reflector layer positioned further from the front of the photovoltaic device than a p-n junction of the photovoltaic device.

8. The method of claim 1 further comprising depositing an anti-reflective coating on the island layer.

9. The method of claim 1 wherein the formation of the one or more islands is controlled at least in part by a lattice mismatch between the first material and the second material.

10. The method of claim 1 wherein the one or more islands include a plurality of islands, and wherein the plurality of islands have variable dimensions relative to each other, such that the textured surface causes light photons to scatter at randomized angles.

11. The method of claim 1 wherein the second material is a semiconductor and includes at least one of the group consisting of: gallium, aluminum, indium, phosphorus, nitrogen, and arsenic.

12. The method of claim 1 wherein the second material has a larger band gap than the first material.

13. The method of claim 1 wherein depositing the third layer of a third material further comprises:
   sequentially depositing a semiconductor contact layer over the island layer; and depositing a dielectric layer over the semiconductor contact layer.

14. A textured layer in a photovoltaic device, the textured layer fabricated using the process of claim 1.

15. A method for providing an photovoltaic device, the method comprising:
   sequentially depositing an absorber layer;
   then depositing an emitter layer;
   then depositing a first layer of a first material over the emitter layer and the absorber layer;
   then depositing an island layer of a second material on the first layer, including forming one or more islands of the second material during the deposition of the island layer to provide at least one textured surface operative to cause scattering of light; depositing a dielectric layer over the island layer; and
   then depositing a metal layer over the dielectric layer; and then lifting the device off the substrate, such that after the lift off the first layer is closer than the island layer to a light facing side of the device; wherein the device comprises the first layer, the island layer and the third layer.

* * * * *